United States Patent [19]

D'Arrigo et al.

[11] Patent Number: 4,652,837
[45] Date of Patent: Mar. 24, 1987

[54] INTEGRATED CIRCUIT OSCILLATOR

[75] Inventors: Sebastiano D'Arrigo, Houston, Tex.; Giuliano Imondi, Rieti; Sossio Vergara, Frattamaggiore, both of Italy

[73] Assignee: Texas Instruments Incorporated, Dallas, Tex.

[21] Appl. No.: 798,268

[22] Filed: Nov. 15, 1985

[51] Int. Cl.$^4$ .............................................. H03K 3/02
[52] U.S. Cl. ...................................... 331/111; 331/143
[58] Field of Search ......................... 331/111, 143, 8; 332/30 V

[56] References Cited

U.S. PATENT DOCUMENTS 4,151,473  4/1979  Coleman et al. .................... 331/8 X
4,513,258  4/1985  Jamiolkowski et al. ............. 331/111

*Primary Examiner*—Eugene R. LaRoche
*Assistant Examiner*—Robert J. Pascal
*Attorney, Agent, or Firm*—Richard A. Bachand; N. Rhys Merrett; Melvin Sharp

[57] ABSTRACT

An oscillator for an integrated circuit which includes a Schmitt trigger having an upper threshold voltage $V_H$ and a lower threshold voltage $V_L$, a capacitor coupled between an input to the trigger and ground, a current generator coupled to the trigger input for charging the capacitor at a constant rate and a current generator coupled to the trigger input for discharging the capacitor at a constant rate. A charge switch in series with the charging current generator reversibly couples the charging current generator between a source of high voltage and the trigger input in response to a change in state of the trigger from a first state to a second state. A discharge switch in series with the discharging current generator reversibly couples the latter across the capacitor in response to a change in state of the trigger from the second state to the first state.

12 Claims, 18 Drawing Figures

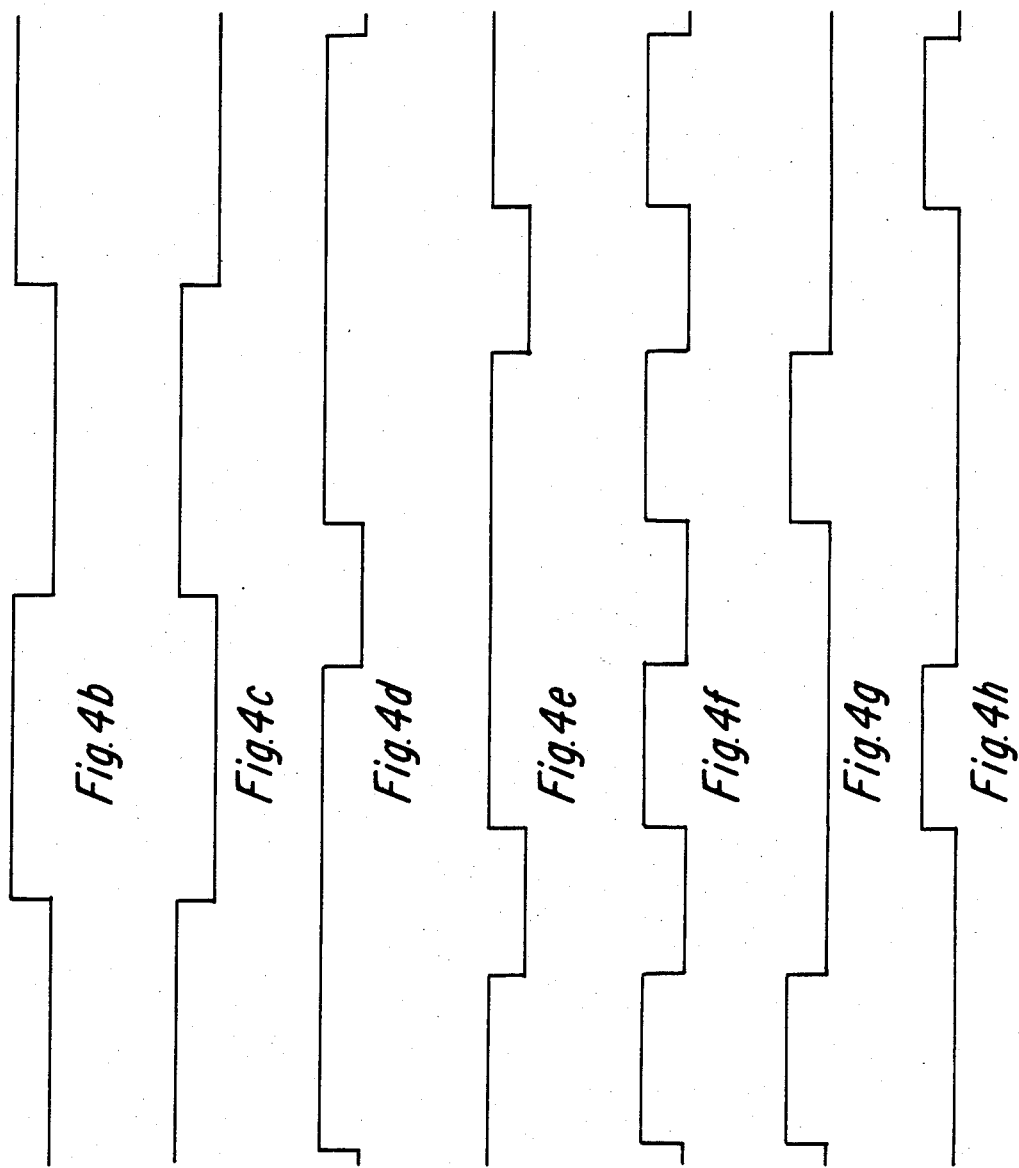

INTEGRATED CIRCUIT OSCILLATOR

BACKGROUND

The present invention relates to an all-silicon oscillator for an integrated circuit whose use is to generate phase clock signals for controlling the operation of various circuits in a VLSI system.

Modern digital integrated circuits typically include a master clock from which there are generated 4 phase clock signals. The master clock employs a Schmitt trigger circuit whose input is coupled to a capacitor that is connected to ground and which is charged through a resistor from a high voltage source. A field effect transistor has its source-to-drain path coupled around the capacitor and its gate connected to the output of the Schmitt trigger in order to discharge the capacitor in response to the latter output going high. Upon the voltage rise across the capacitor increasing to a level $V_H$ the Schmitt trigger switches and turns on the field effect transistor thereby discharging the capacitor. As the input voltage to the Schmitt trigger falls and reaches a value $V_L$ it then switches so that its output falls turning off the transistor connected across the capacitor and turning on the one in series with the resistor thereby repeating the cycle. Various clock signals are derived from the output of the Schmitt trigger by using divide by two circuits in combination with logic circuits. Thus, the repetition rate of the master clock must be at least 4 times faster than the repetition rate of the 4 clocks in the latter system. The slower frequency of the 4 clocks also reduces the power obtainable when such circuits are used as voltage multipliers or charge pumps. Secondly, the duty cycle of the Schmitt trigger output is normally significantly less than 50% for such a system since the discharge time of the capacitor is generally significantly less than its charge time.

Accordingly, it is a principal object of the invention to provide an oscillator that produces clock pulses whose frequency is equal to or greater than that of the oscillator. It is a further object of the invention to provide an oscillator having a duty cycle that is substantially equal to 50%.

SUMMARY OF THE INVENTION

According to the invention there is provided an oscillator for an integrated circuit which includes a Schmitt trigger having an upper threshold voltage $V_H$ and a lower threshold voltage $V_L$, a capacitor coupled between an input to the trigger and ground, a current generator coupled to the trigger input for charging the capacitor at a constant rate and a current generator coupled to the trigger input for discharging the capacitor at a constant rate. A charge switch in series with the charging current generator reversibly couples the charging current generator between a source of high voltage and the trigger input in response to a change in state of the trigger from a first state to a second state. A discharge switch in series with the discharging current generator reversibly couples the latter across the capacitor in response to a change in state of the trigger from the second state to the first state.

Preferably, a first comparator has a non-inverting input connected to the input of the Schmitt trigger and an inverting input coupled to a reference voltage $V_{L1}$ while a second comparator has an inverting input connected to the input of the Schmitt trigger and a non-inverting input coupled to a reference voltage $V_{H1}$. A comparator logic gate has two inputs coupled to respective outputs of the first and second comparators operative to provide an output change when its inputs change to for from a condition in which they are both "1". By making the difference between $V_H$ and $V_{H1}$ and $V_L$ and $V_{L1}$ equal the output of the comparator gate is a clock signal of twice the frequency of the signal at the input of the Schmitt trigger.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 4a–4h are waveform diagrams of the outputs at "a" to "h" of FIG. 3.

DETAILED DESCRIPTION WITH REFERENCE TO THE DRAWINGS

Figure 1:
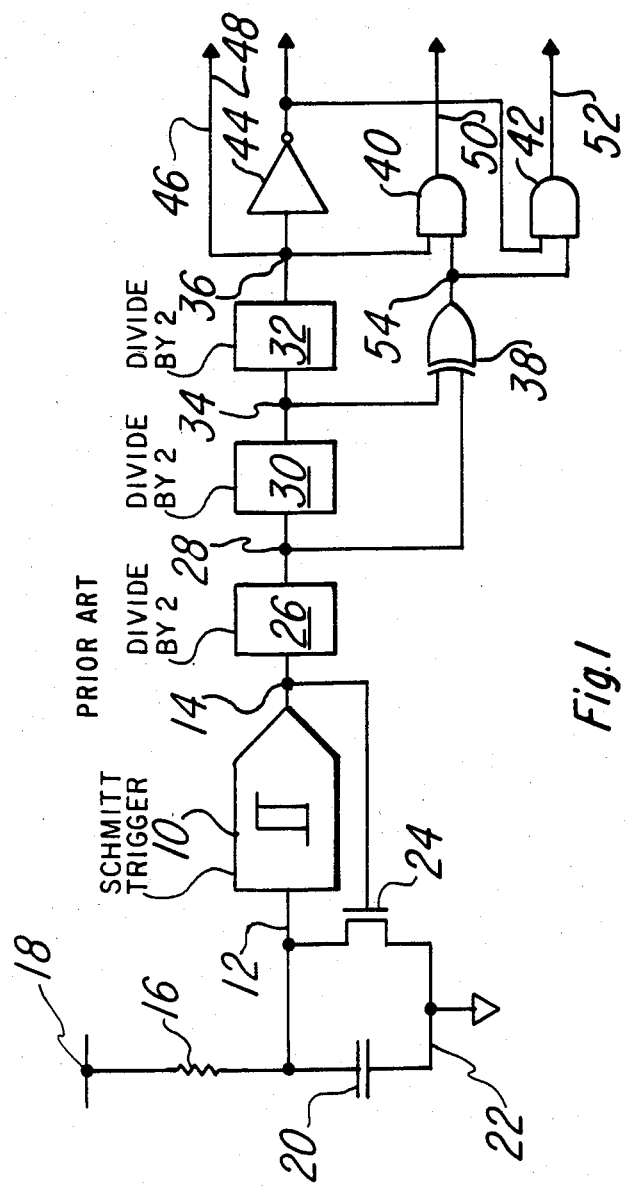
FIG. 1 is a circuit diagram of a conventional oscillator for generating 4 non-overlapping phase clocks.

Referring to FIG. 1, there is shown a conventional oscillator together with circuitry normally used for generating 4 non-overlapping phase clocks. The Schmitt trigger 10 has an input connected to a capacitor 20 the other end of which is connected to ground 22. The capacitor 20 is charged through a resistor 16 connected to a high voltage line 18. A field effect transistor 24 has a source-to-drain path coupled between input 12 and ground 22 and its gate coupled to the output 14 of the Schmitt trigger 10. The output 14 of the trigger 10 passes through a divide-by-two circuit 26 to output 28. Output 28 also passes through a divide-by-two circuit 30 to an output 34 thereof. Both output 28 and output 34 feed into an exclusive or circuit 38 to produce an output 54. Output 34 also passes through a divide-by-two circuit 32 to an output 36. Output 36 is inverted by inverter 44 to produce output 48 and is used as one input to AND circuit 40 with output 54 being the other input thereto. The output 50 of circuit 40 forms one clock output. Outputs 48 and 54 are each fed into one input of AND circuit 42 to produce output 52.

Figure 2A:
FIGS. 2a–2h are waveform diagrams of the outputs at "a" to "h" of FIG. 1 herein.
Figure 2B:
Figure 2C:
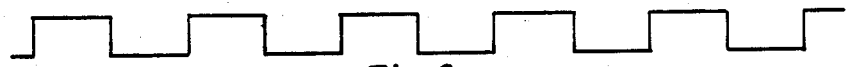

Functionally, capacitor 20 charges up through resistor 16 until its voltage reaches an upper threshold $V_H$ of the Schmitt trigger 10 at which point the trigger output 10 goes high and turns on transistor 24 discharging capacitor 20 through the channel resistance of transistor 24 in parallel with resistor 16. When the voltage across the capacitor 20 reaches a value $V_L$ the output of trigger 10 goes low turning off transistor 24 and once again permitting capacitor 20 to charge up through resistor 16. FIG. 2a illustrates the form of the output 14 of trigger 10. After passing through divide-by-two circuit 26 the output 28 has ½ the frequency of the output 14 as seen in FIG. 2b. Further divisions by two by circuits 30 and 32 result in outputs 34 and 36, respectively, shown in FIGS. 2c and 2d, respectively. Inversion of output 36 produces output 48 shown in FIG. 2e. FIG. 2f shows the output 54 of the exclusive or circuit 38 operating on outputs 28 and 34. Output 50 obtained from AND circuit 40 the inputs of which are output 36 and output 54 is shown in FIG. 2g while output 52 from AND gate 42 resulting from inputs from output lines 54 and 48 is shown in FIG. 2h.

Figure 2D:
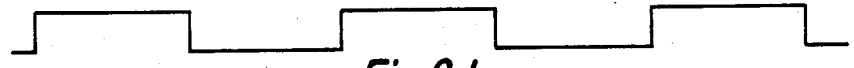
Figure 2E:
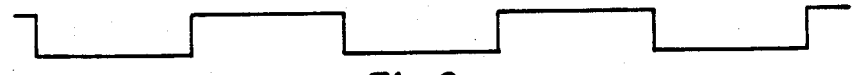
Figure 2F:
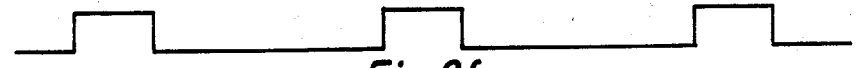
Figure 2G:
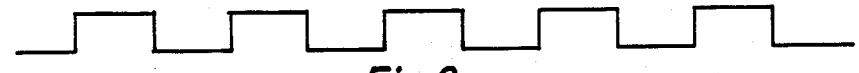
Figure 2H:
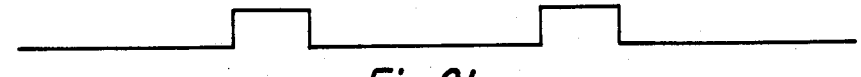

It will be appreciated that the non-overlapping output clock signals represented by FIGS. 2d, 2e, and 2h have a frequency of ⅛ of that of output 14 of trigger 10 shown in FIG. 2a. Moreover, the duty cycle of the waveform of FIG. 2a is significantly less than 50%.

Figure 3:
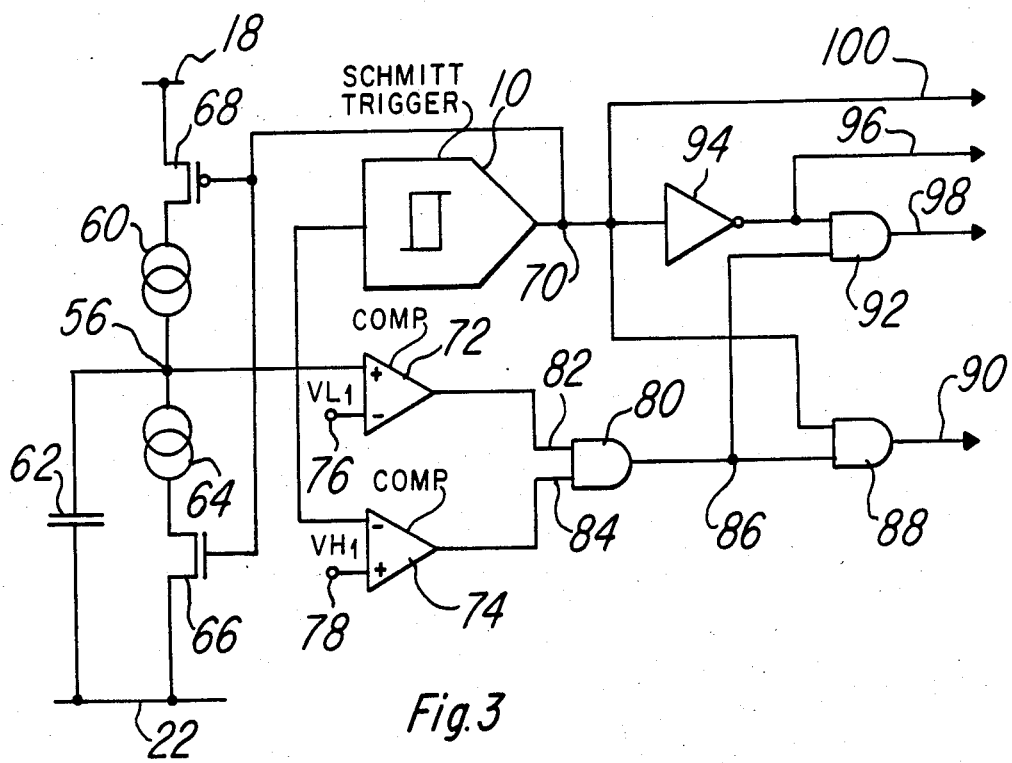
FIG. 3 is a circuit diagram of a preferred embodiment of an oscillator for generating 4 phase clock signals of frequency equal to or twice that of the oscillator frequency.

A preferred embodiment of the invention shown in FIG. 3 using the Schmitt trigger 10 again has a capacitor 62 coupled from its input 56 to ground 22. However, a current generator 60 is used instead to charge the capacitor 62 at a substantially constant rate. A p-channel transistor 68 whose gate is connected to the output of the trigger 10 controls charging. A discharging current generator 64 discharges capacitor 62. An n-channel transistor 66 having a gate also coupled to output 70 of trigger 10 controls the flow of discharge current through generator 64 to ground 22. A pair of comparators 72 and 74 have their non-inverting and inverting inputs, respectively, coupled to input 56 while their inverting 76 and non-inverting 78 inputs are connected to reference voltages $V_{L1}$ and $V_{H1}$, respectively. The outputs 82 and 84 of comparators 72 and 74, respectively, are fed into an AND gate 80 resulting in an output on output line 86. The output 70 of trigger 10 is inverted by inverter 94 to give an output on line 96. The output on line 96 forms one input to AND gate 92 with the other being line 86. Outputs on lines 70 and 86 are fed into AND gate 88 to produce an output on line 90.

Figure 4A:
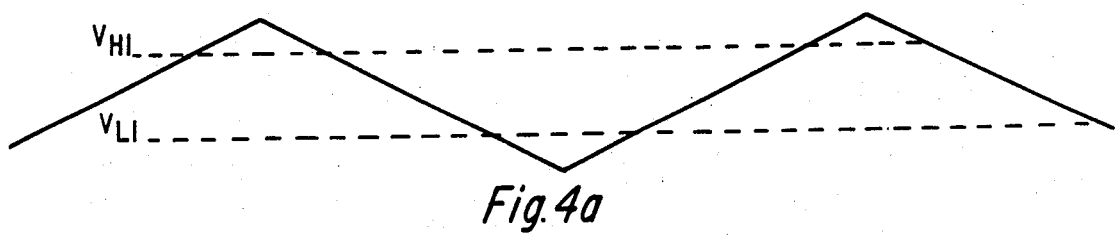

Operationally, with the output of trigger 10 low transistor 66 will be off while transistor 68 will be on. Thus, current through current generator 60 will flow into capacitor 62, charging the latter up at a constant rate as shown in FIG. 4a. Upon the voltage at input 56 reaching a value $V_{L1}$, comparator 72 switches to having a high output with comparator 74 also being high. Thus, the output 86 of AND gate 80 will go high and remain high until a voltage $V_{H1}$ is reached at which point comparator 74 will switch to having a low output turning off AND gate 80 and driving output 86 low again. Upon reaching the upper threshold voltage $V_H$ trigger 10 switches to having an output 70 which is high. Thus, transistor 68 is cut off thereby cutting off current from flowing into capacitor 62 while transistor 66 is turned on allowing current generator 64 to discharge capacitor 62 at a substantially constant rate. When the input voltage drops to $V_{H1}$ comparator 74 switches to having a high output 84 resulting in both inputs 84 and 82 being high and driving output 86 high again. The latter output stays high until the voltage on output line 86 reaches $V_{L1}$ at which time comparator 72 switches to having a low output again dropping output line 86 low. The operation of AND gates 92 and 88 can best be understood from the waveforms given in FIGS. 4a to 4h.

The output of trigger 10 on line 70 is shown in FIG. 4b while that on line 96 being the inverse of the former is shown in FIG. 4c. The output on line 82 from comparator 72 is seen in FIG. 4d while that on line 84 is seen in FIG. 4e. FIG. 4f shows the output on line 86 as previously explained. FIG. 4g shows the result of applying "and" logic to the waveforms of FIGS. 4c and 4f. While FIG. 4h shows the result of applying "and" logic to the waveforms of FIGS. 4b and 4f. Thus, it will be seen that by making $V_H - V_{H1}$ equal to $V_{L1} - V_L$ on the waveform of FIG. 4f representing the output on line 86 successive lows will have equal time durations as will successive highs but the duration of the lows will not necessarily equal that of the highs. The result is that the waveform of FIG. 2f will have twice the frequency of that of FIG. 4a. By making $V_{H1} - V_{L1}$ equal to twice $V_H - V_{H1}$ the time durations of the lows and the highs will all be equal and the waveform will be perfectly symmetrical with a duty cycle of 50%.

Another result is that the 4 non-overlapping outputs represented by FIGS. 4b, 4c, 4g and 4h all have frequencies equalling that of trigger 10 as its output appears on line 70.

Recognizing that it may not always be possible to guarantee the symmetry of the voltage waveform across the capacitor 62 considering that either the current through generator 60 or that through generator 64 may vary slightly. In this case the waveform represented by FIG. 4f would have a duty cycle slightly different from 50%. It will be readily appreciated that by dividing the output on line 86 by two a non complex waveform of close to a 50% duty cycle can easily be obtained albeit at the same frequency as the waveform on line 70.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An integrated circuit oscillator, comprising:
   a Schmitt trigger having an input, an output, an upper threshold $V_H$ and a lower threshold $V_L$;
   a capacitor connected between the input and a ground potential $V_{ss}$;
   a charge current generator coupled to the input for charging said capacitor at a predetermined substantially constant rate;
   charge starting means for initiating charging of said capacitor by said charge current generator in response to a change in output of said Schmitt trigger from a first to a second state;
   a discharge current generator coupled across said capacitor for discharging the latter at a predetermined substantially constant rate; and
   discharge starting means for initiating discharging of said capacitor by said discharge current generator in response to a change in output from the second to the first state.

2. An oscillator according to claim 1, including a first comparator having an inverting input coupled to a reference voltage $V_{L1}$ and a non-inverting input coupled to the input of said trigger, a second comparator having a non-inverting input connected to a reference voltage $V_{H1}$ and an inverting input connected to the input of said trigger, and a comparator logic circuit having one input coupled to an output of said first comparator and another input coupled to an output of said second comparator wherein $V_{L1}$ and $V_{H1}$ are between $V_L$ and $V_H$ and such that the output of said circuit is high when the input voltage of said trigger is between $V_{L1}$ and $V_{H1}$ and low otherwise.

3. An oscillator according to claim 2, wherein the outputs of said trigger and said comparator gate are applied to logic circuits to provide output clock signals.

4. An oscillator according to claim 2, wherein the values of $V_{H1}$ and $V_{L1}$ are selected such that the signal from said comparator logic circuit has a frequency of twice that of the output of said Schmitt trigger.

5. An oscillator according to claim 2, wherein the values of $V_{H1}$ and $V_{L1}$ are selected such that the signal from said comparator logic gate has substantially a 50% duty cycle.

6. An oscillator according to claim 2, wherein the values of $V_{H1}$ and $V_{L1}$ are selected such that $V_H - V_{H1}$ substantially equals $V_L - V_{L1}$ and $2(V_H - V_{H1})$ substantially equals $V_{H1} - V_{L1}$.

7. An oscillator according to claim 2, wherein said charge switch is a p-channel field effect transistor having a source-to-drain path coupled in series with the charge current generator and a gate coupled to the output of said Schmitt trigger and the discharge switch is an n-channel field effect transistor having a source-to-drain path coupled in series with the discharge current generator and having a gate connected to the output of said Schmitt trigger.

8. An oscillator according to claim 2, wherein said logic circuit is an "and" circuit.

9. An oscillator according to claim 7, including a second "and" circuit having one input coupled to an output of said comparator "and" circuit and another input coupled to the output of said Schmitt trigger.

10. An oscillator according to claim 7, including a third "and" circuit and an inverter wherein an input of said inverter is coupled to the output of said Schmitt trigger and an output of the inverter to an input of said third "and" circuit, and another input of said third "and" circuit coupled to an output of said comparator "and" circuit.

11. An oscillator according to claim 1, wherein said charge starting means is a charge switch in series with said current generator reversibly switching from a closed to an open condition in response to a change in the output of said Schmitt trigger from the first to the second state.

12. An oscillator according to claim 1, wherein said discharge starting means is a charge switch in series with said discharge current generator reversibly switching from an open to a closed condition in response to a change in output of said Schmitt trigger from the first to the second state.

* * * * *